US009568513B2

(12) United States Patent
Venkatasubramanian et al.

(10) Patent No.: US 9,568,513 B2
(45) Date of Patent: Feb. 14, 2017

(54) SYSTEMS AND METHODS TO DETECT POORLY DAMPED OSCILLATION MODES

(71) Applicant: Schweitzer Engineering Laboratories, Inc., Pullman, WA (US)

(72) Inventors: Vaithianathan Venkatasubramanian, Pullman, WA (US); Zaid Tashman, San Mateo, CA (US); Hamed Khalilinia, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 97 days.

(21) Appl. No.: 14/180,631

(22) Filed: Feb. 14, 2014

(65) Prior Publication Data

US 2014/0225626 A1 Aug. 14, 2014

Related U.S. Application Data

(60) Provisional application No. 61/764,683, filed on Feb. 14, 2013.

(51) Int. Cl.
*H03B 28/00* (2006.01)
*G01R 31/28* (2006.01)
*G01R 19/25* (2006.01)

(52) U.S. Cl.
CPC .......... *G01R 19/2513* (2013.01); *Y02E 60/728* (2013.01); *Y04S 10/265* (2013.01)

(58) Field of Classification Search
CPC ....... G01R 19/2513; H03L 1/00; Y02E 60/28; Y02E 60/287; Y04S 10/265
USPC ........................................................ 324/537
See application file for complete search history.

(56) References Cited

U.S. PATENT DOCUMENTS

| | | | |
|---|---|---|---|
| 4,510,944 A * | 4/1985 | Porges | ........................... 600/500 |
| 4,646,218 A | 2/1987 | Scholer | |
| 4,928,054 A | 5/1990 | Martin-Lopez | |
| 5,426,537 A * | 6/1995 | Yeh et al. | ........................ 360/46 |
| 5,594,659 A | 1/1997 | Schlueter | |
| 5,610,834 A | 3/1997 | Schlueter | |

(Continued)

OTHER PUBLICATIONS

Sant, Aprajita, Screening Procedure to Identify Power System Events of the Texas Synchrophasor Network, May 2012, The University of Texas at Austin, Masters Degree Thesis.*
Sezi et al. ("Bringing New Visualization Tools for the Detection and Mitigation of Dynamic Phenomena in the Transmission System"; 2008; CIGRE, International Council on Large Electric Systems—C2-112_2008; https://dipot.ulb.ac.be/dscpace/bitstream/2013/186597/1/Sezi_C2-112.pdf, hereinafter referred to as Sezi).*

(Continued)

*Primary Examiner* — Melissa Koval
*Assistant Examiner* — Rahul Maini
(74) *Attorney, Agent, or Firm* — Stoel Rives, LLP; Richard M. Edge

(57) ABSTRACT

A plurality of measurement signals may be evaluated to detect a poorly damped oscillation mode in an electric power delivery system. An oscillation mode of interest may be detected, and the oscillation mode of interest may be analyzed using a frequency transform. A plurality of amplitudes of the oscillation mode of interest in each measurement signal may be determined using a sliding window. The plurality of amplitudes may be used to calculate a damping of the oscillation mode of interest. The damping may be calculated solving a linearized system of equations. The linearized system of equations may be a least square estimate of the damping based on the logarithm of each amplitude. If the damping indicates that the oscillation mode of interest is poorly damped, a control action may be taken.

18 Claims, 6 Drawing Sheets

(56) References Cited

U.S. PATENT DOCUMENTS

| | | |
|---|---|---|
| 6,219,591 B1 | 4/2001 | Vu |
| 6,236,949 B1 | 5/2001 | Hart |
| 6,249,876 B1 | 6/2001 | Balakrishnan |
| 6,476,521 B1 | 11/2002 | Lof |
| 6,492,801 B1 | 12/2002 | Sims |
| 6,662,124 B2 | 12/2003 | Schweitzer |
| 6,694,270 B2 | 2/2004 | Hart |
| 6,845,333 B2 | 1/2005 | Anderson |
| 7,149,637 B2 | 12/2006 | Korba |
| 7,480,580 B2 | 1/2009 | Zweigle |
| 7,630,863 B2 | 12/2009 | Zweigle |
| 7,660,649 B1 | 2/2010 | Hope |
| 7,987,059 B2 | 7/2011 | Gong |
| 8,000,914 B2 * | 8/2011 | Venkatasubramanian et al. .............. 702/60 |
| 8,498,832 B2 | 7/2013 | Venkatasubramanian |
| 2003/0220752 A1 | 11/2003 | Hart |
| 2004/0059469 A1 | 3/2004 | Hart |
| 2004/0093177 A1 | 5/2004 | Schweitzer |
| 2005/0187726 A1 | 8/2005 | Korba |
| 2006/0030972 A1 | 2/2006 | Schlueter |
| 2006/0067095 A1 | 3/2006 | Hou |
| 2006/0224336 A1 | 10/2006 | Petras |
| 2007/0206644 A1 | 9/2007 | Bertsch |
| 2008/0074810 A1 | 3/2008 | Guzman-Casillas |
| 2008/0077368 A1 | 3/2008 | Nasle |
| 2009/0089608 A1 | 4/2009 | Guzman-Casillas |
| 2009/0222144 A1 | 9/2009 | Venkatasubramian |
| 2012/0323397 A1 | 12/2012 | Schweitzer |

OTHER PUBLICATIONS

PCT/US2014/016521 Patent Cooperation Treaty, International Search Report and Written Opinion of the International Searching Authority, May 14, 2014.

A.P. Sakis Meliopoulos, George J. Cokkinides, Floyd Galavan, Bruce Fardanesh, Distributed State Estimator—Advances and Demonstration, Proceedings of the 41st Hawaii International Conference on System Sciences, Jan. 7, 2008.

Saman A. Zonouz, William H. Sanders, A Kalman-based Coordination for Hierarchical State Estimation: Algorithm and Analysis, Proceedings of the 41st Hawaii International Conference on System Sciences, Jan. 7, 2008.

Jinyu Xiao, Xiaorong Xie, Yingduo Han, and Jingtao Wu, Dynamic Tracking of Low-frequency Oscillations with Improved Prony Method in Wide-Area Measurement System, Power Engineering Society General Meeting, IEEE, Jun. 10, 2004.

Patent Cooperation Treaty, International Search Report and Written Opinion of the International Searching Authority, PCT/US2008/079219, Apr. 9, 2010.

Olof Samuelsson, Helga Johannsdottir, Nils Gustafson, Thorhallurhrafnsson Daniel Karlsson, Mike Kockott, Johan Salj, Arve Sollie, Power System Damping in Iceland Based on Phasor Measurements, Jan. 2002.

P. Zhang, Measurement-Based Load Modeling, EPRI Electric Power Research Institute, Dec. 6, 2006.

Cold Load Pickup Issues, A Report to the Line Protection Subcommittee of the Power System Relay Committee of the IEEE Power Engineering Society, May 16, 2008.

* cited by examiner

SYSTEMS AND METHODS TO DETECT POORLY DAMPED OSCILLATION MODES

RELATED APPLICATIONS

This application claims priority to U.S. Patent Application Ser. No. 61/764,683 filed Feb. 14, 2013 and entitled "Modal Analysis in an Electric Power System," which is hereby incorporated by reference herein in its entirety.

TECHNICAL FIELD

This disclosure relates to systems and methods for detecting poorly damped oscillation modes in an electric power delivery system. More particularly, this disclosure relates multi-dimensional, frequency-based analysis of oscillation modes in an electric power delivery system.

DETAILED DESCRIPTION OF PREFERRED EMBODIMENTS

Figure 1:
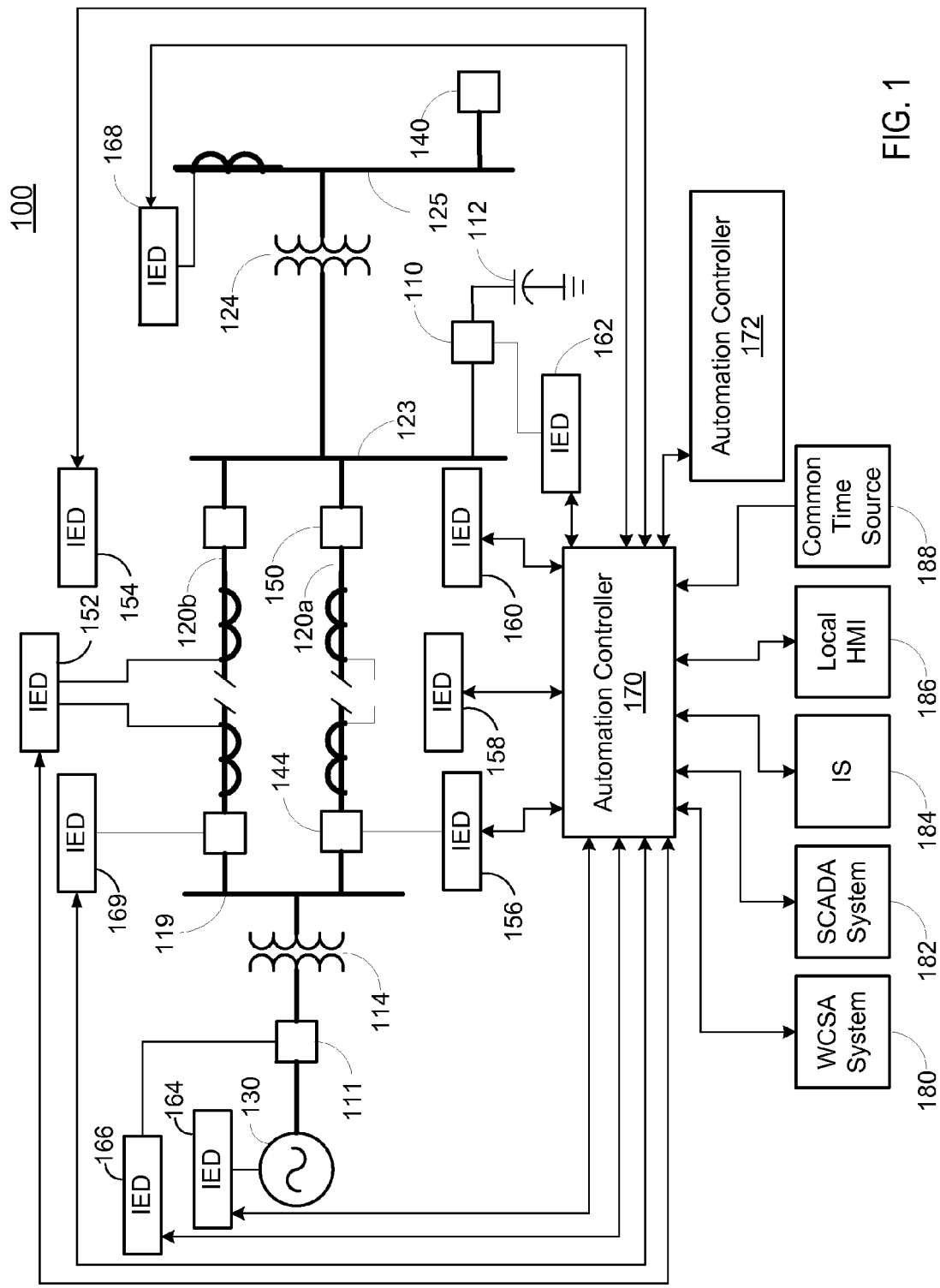
FIG. 1 illustrates a simplified one-line diagram of an electric power delivery system.

Oscillatory instability in an electric power delivery system can reduce power quality and system reliability, damage expensive equipment, and even lead to widespread blackouts if left uncorrected. Real-time monitoring of damping of oscillation modes can detect oscillatory instability before it causes problems so corrective actions can be taken. Unfortunately, many methods of computing damping of oscillation modes are computationally intensive and/or unreliable and thus unusable in existing power system components for real-time monitoring. Accordingly, there is a need for a computationally efficient and reliable method of detecting oscillatory instability.

Phasor measurement units (PMUs) may be configured to collect phasor measurements at various points along an electric power delivery system. The phasor measurements may include synchrophasors (e.g., phasors synced to a time source). An intelligent electronic device (IED), such as a relay, may receive measurement signals from a plurality of PMUs, which may be at disparate locations in the electric power delivery system. The IED may determine from the plurality of measurement signals whether a poorly damped oscillation mode is present at one or more of the monitored locations on the electric power delivery system. If a poorly damped oscillation mode is detected, a control action may be taken. The control action may be taken by the IED, and/or another device (e.g., an automation controller, a central monitoring system, etc.) may be informed by the IED that a control action should be taken. The control action may include undoing an action that caused the poorly damped oscillation mode, connecting or disconnecting a capacitor bank, tripping a relay and/or breaker, and/or the like.

To determine whether a poorly damped oscillation mode is present, the IED may determine an oscillation mode of interest to be analyzed. The IED may compute a frequency transform of at least one of the measurement signals, and the oscillation mode of interest may be determined based on the frequency transform. For example, the IED may select a predetermined number of frequencies with the largest amplitude(s) and/or one or more frequencies with amplitude above a predetermined threshold as the oscillation modes of interest. The frequency transform may be a Fourier transform, a wavelet transform (WT), a cosine transform (CT), a Laplace transform, a Z-transform, and/or the like.

A damping of the oscillation mode of interest may be computed based on changes over time in amplitudes of the oscillation mode of interest in the plurality of measurement signals. The amplitudes of the oscillation mode of interest in each measurement signal may be determined by computing a frequency transform of each measurement signal. To determine variations over time, the frequency transform may be computed over a sliding window. The amplitude of the oscillation mode of interest for each measurement signal may be computed over the sliding window at a particular time, and the sliding window may then be shifted by a time period, such as a time period determined based on the frequency of the oscillation mode of interest. In an embodiment, the time period may be a multiple (e.g., 0.25, 0.5, 1, 2, 3, 4, etc.) of the period of the oscillation mode of interest. A new amplitude may be computed over the shifted window for each measurement signal. In some embodiments, a predetermined number of steps may be taken and/or the sliding window may be shifted within a predetermined static window before the computed amplitudes are analyzed. The locations of the sliding window may correspond between measurement signals (e.g., there may be a common set of time points for which the amplitudes are determined).

The IED may solve a linearized system of equations including the amplitudes over time in the plurality of measurement signals. In some embodiments, the damping may include an exponential decrease in the amplitude of the measurement signals. Accordingly, the amplitudes may be linearized by taking a logarithm (e.g., a natural logarithm) of the amplitude values. Solving the linearized system of equations may include finding one or more best fit lines for the plurality of measurement signals. The best fit may be determined by finding a least square estimate, finding an estimate that minimizes absolute error, finding an estimate that minimizes maximum error, and/or the like. For example, solving the linearized system of equations may include finding a common slope of a best fit line for the logarithms of each of the plurality of measurement signals, wherein the plurality of best fit lines share the common slope but can have distinct offsets (e.g., y-intercepts). The damping ratio may then be calculated as the ratio of the common slope to the angular frequency of oscillation mode of interest. The damping ratio may be compared to one or more predetermined thresholds to determine whether a control action needs to be taken. Alternatively, or in addition, the common slope may be compared directly to one or more predetermined thresholds.

The performance in detecting poorly damped oscillation modes may be improved by performing additional processing on the plurality of measurement signals before and/or after computing the damping ratio. For example, pre-processing may include discarding measurement signals that do not contain any information, and interpolating missing data points in measurement signals that are missing data points. In addition, the damping ratio may be computed only when an event has occurred. Accordingly, one or more measurement signals may be checked for events. A sudden event that occurs in the middle of the sliding window may appear to be negatively damped even if it is not. Thus, if an event has occurred, the IED may determine whether a sudden large jump has occurred (e.g., whether a signal jump is above a predetermined threshold).

If the signal jump is below the predetermined threshold, the measurement signals may be preprocessed and detrended. Preprocessing may include removing a mean value from each measurement signal to prevent a DC component from appearing in the frequency transform. Preprocessing may also include normalizing the measurement signals by dividing each measurement signal by a max value inside the sliding window. Detrending may include removing any drift that exists in each measurement signal. For example, detrending may include fitting a polynomial (e.g., a low-order polynomial, such as a first, second, third, fourth, fifth, etc. order polynomial) to a measurement signal to represent trending and subtracting the polynomial from the measurement signal. The best fit may be determined by finding a least square estimate, finding an estimate that minimizes absolute error, finding an estimate that minimizes maximum error, and/or the like.

The damping ratio may then be computed from the measurement signals that have undergone the additional processing. One or more of the measurement signals may be checked for oscillation modes of interest. For each oscillation mode of interest, the measurement signals containing that oscillation mode may be analyzed as previously discussed to determine the damping ratio. A statistical measure may be computed for the calculated damping ratio to determine if any invalid signals remained after the additional processing. Any bad signals may be discarded, and the damping ratio may be recalculated without the bad signals. After the damping ratio has been determined, a plurality of consecutive damping ratios may be compared for consistency. If a predetermined number of consecutive estimates are outside one or more predetermined thresholds (e.g., the damping ratio is less than a predetermined minimum damping threshold), the IED may determine a poorly damped oscillation is occurring and perform a control action. Alternatively, or in addition, the frequency, damping ratio, mode shape, and/or the like may be reported if poorly damped oscillation is detect and/or regardless of whether a poorly damped oscillation is detected. Performing a control action and reporting information about an oscillation mode are collectively referred to as performing a responsive action.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described will be illustrated as software modules or components. As used herein, a software module or component may include any type of computer instruction or computer executable code located within a memory device that is operable in conjunction with appropriate hardware to implement the programmed instructions. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a machine-readable storage medium having stored thereon instructions that may be used to program a computer (or other electronic device) to perform processes described herein. The machine-readable storage medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/machine-readable medium suitable for storing electronic instructions.

FIG. 1 illustrates a simplified one-line diagram of an electric power delivery system 100. Although illustrated as a one-line diagram, the electric power delivery system 100 may represent a three phase power system. FIG. 1 illustrates a single phase system for simplicity.

The electric power delivery system 100 includes, among other things, a generator 130, configured to generate a sinusoidal waveform. A step-up power transformer 114 may be configured to increase the generated waveform to a higher voltage sinusoidal waveform. A first bus 119 may distribute the higher voltage sinusoidal waveform to transmission lines 120a and 120b, which in turn connect to a second bus 123. Breakers 144, 150, 110, and 111, may be configured to be selectively actuated to reconfigure the electric power delivery system 100. For example, one breaker 110 may selectively connect a capacitor bank 112 to the second bus 123 to maintain a proper balance of reactive power. A step-down power transformer 124 may be configured to transform the higher voltage sinusoidal waveform to lower voltage sinusoidal waveform that is suitable for delivery to a load 140.

IEDs 152-169, shown in FIG. 1, may be configured to control, monitor, protect, and/or automate the electric power system 100. As used herein, an IED may refer to any microprocessor-based device that monitors, controls, automates, and/or protects monitored equipment within an electric power system. Such devices may include, for example, PMUs, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, motor drives, and the like. The IEDs 152-169 may gather status information from one or more pieces of monitored equipment. The IEDs 152-169 may receive information concerning monitored equipment using sensors, transducers, actuators, and the like.

The IEDs 152-169 may also gather and transmit information gathered about monitored equipment. Although FIG. 1 shows separate IEDs monitoring a signal (e.g., 158) and controlling a breaker (e.g., 160) these capabilities may be combined into a single IED. FIG. 1 shows various IEDs performing various functions for illustrative purposes and does not imply any specific arrangements or functions required of any particular IED. IEDs may be configured to monitor and communicate information, such as voltages, currents, equipment status, temperature, frequency, pressure, density, infrared absorption, radio-frequency information, partial pressures, viscosity, speed, rotational velocity, mass, switch status, valve status, circuit breaker status, tap status, meter readings, and the like. IEDs may also be configured to communicate calculations, such as phasors (which may or may not be synchronized to a common time source as synchrophasors), relay events (e.g., a permanent fault, a temporary fault, an overcurrent condition, an undervoltage condition, a high temperature condition, an inrush condition, a backfeed condition, direction of current flow, loss of potential, a switching transient, a system overload, an exceeded load profile, etc.), relay event data corresponding to a relay event (e.g., graphic waveform data, such as voltages and/or currents, associated with the relay event), fault distances, differentials, impedances, reactances, frequency, and the like. IEDs may also communicate settings information, IED identification information, communications information, status information, alarm information, and the like. Information of the types listed above, or more generally, information about the status of monitored equipment is referred to as monitored system data. Each IED may generate monitored system data regarding properties of the electric power delivery system 100 at points proximate to the IED. The monitored system data may include a plurality of measurements (e.g., phasors, synchrophasors, graphic waveform data, etc.) over time of a single electrical system characteristic at a single location. The plurality of measurements is referred to as a measurement signal.

The IEDs 152-169 may also issue control instructions to the monitored equipment in order to control various aspects relating to the monitored equipment. For example, an IED may be in communication with a circuit breaker, and may be capable of sending an instruction to open and/or close the circuit breaker, thus connecting or disconnecting a portion of a power system. In another example, an IED may be in communication with a recloser and capable of controlling reclosing operations. In another example, an IED may be in communication with a voltage regulator and capable of instructing the voltage regulator to tap up and/or down. Other examples of control instructions that may be implemented using IEDs may be known to one having skill in the art, but are not listed here. Information of the types listed above, or more generally, information or instructions directing an IED or other device to perform a certain action is referred to as control instructions. The action to be performed by the IED or other device may be referred to as a control action.

The IEDs 152-169 may be linked together using a data communications network, and may further be linked to a central monitoring system, such as a SCADA system 182, an information system (IS) 184, or a wide area control and situational awareness (WCSA) system 180. The embodiment of FIG. 1 illustrates a star topology having an automation controller 170 at its center, however, other topologies are also contemplated. For example the IEDs 152-169 may be connected directly to the SCADA system 182 or the WCSA system 180. The data communications network of FIG. 1 may include a variety of network technologies, and may comprise network devices such as modems, routers, firewalls, virtual private network servers, and the like. The IEDs and other network devices may be connected to the communications network through a network communications interface.

The IEDs 152-169 are connected at various points to the electric power delivery system 100. A first IED 152 may be configured to monitor conditions on a first transmission line 120b, while a second IED 158 may monitor conditions on a second transmission line 120a. A plurality of breaker IEDs 154, 156, 160, and 169 may be configured to issue control instructions to associated breakers. A third IED 168 may monitor conditions on a third bus 125. A fourth IED 164 may monitor and issue control instructions to a generator 130, while a fifth IED 166 may issue control instructions to a breaker 111.

In certain embodiments, including the embodiment illustrated in FIG. 1, communication among various IEDs and/or higher level systems (e.g., the SCADA system 182 or the IS 184) may be facilitated by the automation controller 170. The automation controller 170 may also be referred to as a central IED or access controller. In various embodiments, the automation controller 170 may be embodied as the SEL-2020, SEL-2030, SEL-2032, SEL-3332, SEL-3378, or SEL-3530 available from Schweitzer Engineering Laboratories, Inc. of Pullman, Wash., and also as described in U.S. Pat. Nos. 5,680,324, 7,630,863, and U.S. Patent Application Publication No. 2009/0254655, the entireties of which are incorporated herein by reference.

Centralizing communications in the electric power delivery system 100 using the automation controller 170 may provide the ability to manage a wide variety of IEDs in a consistent manner. The automation controller 170 may be capable of communicating with IEDs of various types and using various communications protocols. The automation controller 170 may provide a common management interface for managing connected IEDs, thus allowing greater uniformity and ease of administration in dealing with a wide variety of equipment. It should be noted that although an automation controller 170 is used in this example, any device capable of storing time coordinated instruction sets and executing such may be used in place of the automation controller 170. For example, an IED, programmable logic controller, computer, or the like may be used. Any such device is referred to herein as a communication master.

In various embodiments, devices within the electric power delivery system 100 may be configured to operate in a peer-to-peer configuration. In such embodiments, the communication master may be selected from among the available peer devices. Further, the device designated as the communications master may be changed. Such changes may occur as a result of losing communication with a device previously selected as a communications master, as a result of a change in the configuration of electric power delivery system 100, the detection of a specific condition triggering time coordinated action by an IED that is not designated as the communication master at the time of the occurrence of the condition, or under other circumstances.

The IEDs 152-169 may communicate information to the automation controller 170 including, but not limited to status and control information about the individual IEDs, IED settings information, monitored system data, calculations made by individual IEDs, event (fault) reports, communications network information, network security events, and the like. The automation controller 170 may be in communication with a second automation controller 172 in order to increase the number of connections to pieces of monitored equipment or to extend communication to other electric power delivery systems. In alternative embodiments, the automation controller 170 may be directly connected to one or more pieces of monitored equipment (e.g., the generator 130 or the breakers 111, 144, 150, 110).

The automation controller 170 may also include a local human machine interface (HMI) 186. Alternatively, or in addition, the automation controller 170 may be removeably coupleable to a human machine interface, such as a laptop, tablet, cell phone, or the like, through a wireless and/or wired connection, and/or the automation controller 170 may provide a remote human machine interface, such as remote access to an internet-browser-renderable platform over an internet protocol (IP) network. The local HMI 186 may be located at the same substation as the automation controller 170. The local HMI 186 may be used to change settings, issue control instructions, retrieve an event (fault) report, retrieve data, and the like. In this structure, the automation controller 170 may include a programmable logic controller accessible using the HMI 186. A user may use the programmable logic controller to design and name time coordinated instruction sets that may be executed using the HMI 186. The time coordinated instruction sets may be stored in computer-readable storage medium (not shown) on automation controller 170.

The time coordinated instruction set may be developed outside the automation controller 170 (e.g., using WCSA System, or SCADA System) and transferred to the automation controller or through the automation controller to the IEDs 152-169 or, in another embodiment without the automation controller 170, directly to the IEDs 152-169, using a communications network, using a USB drive, or otherwise. For example, time coordinated instruction sets may be designed and transmitted via the WCSA system 180. Further, it is contemplated that the automation controller or IEDs may be provided from the manufacturer with pre-set time coordinated instruction sets. U.S. Pat. No. 7,788,731 titled Method and Apparatus for Customization, naming Robert Morris, Andrew Miller, and Jeffrey Hawbaker as inventors, describes such a method, and is hereby incorporated by reference in its entirety.

The automation controller 170 may also be connected to a common time source 188. In certain embodiments, the automation controller 170 may generate a common time signal based on the common time source 188 that may be distributed to the connected IEDs 152-169. Based on the common time signal, various IEDs may be configured to collect time-aligned data points, including synchrophasors, and to implement control instructions in a time coordinated manner. The WCSA system 180 may receive and process the time-aligned data, and may coordinate time synchronized control actions at the highest level of the power system. In another embodiment, the automation controller 170 may not receive a common time signal, but a common time signal may be distributed to the IEDs 152-169.

The common time source 188 may also be used by the automation controller 170 for time stamping information and data. Time synchronization may be helpful for data organization, real-time decision-making, as well as post-event analysis. Time synchronization may further be applied to network communications. The common time source 188 may be any time source that is an acceptable form of time synchronization, including but not limited to a voltage controlled temperature compensated crystal oscillator, a Rubidium and/or Cesium oscillator with or without a digital phase locked loop, MEMs technology, which transfers the resonant circuits from the electronic to the mechanical domains, or a GPS receiver with time decoding. In the absence of a discrete common time source, the automation controller 170 may serve as the time source by distributing a time synchronization signal (received from one of the sources described).

Figure 2:
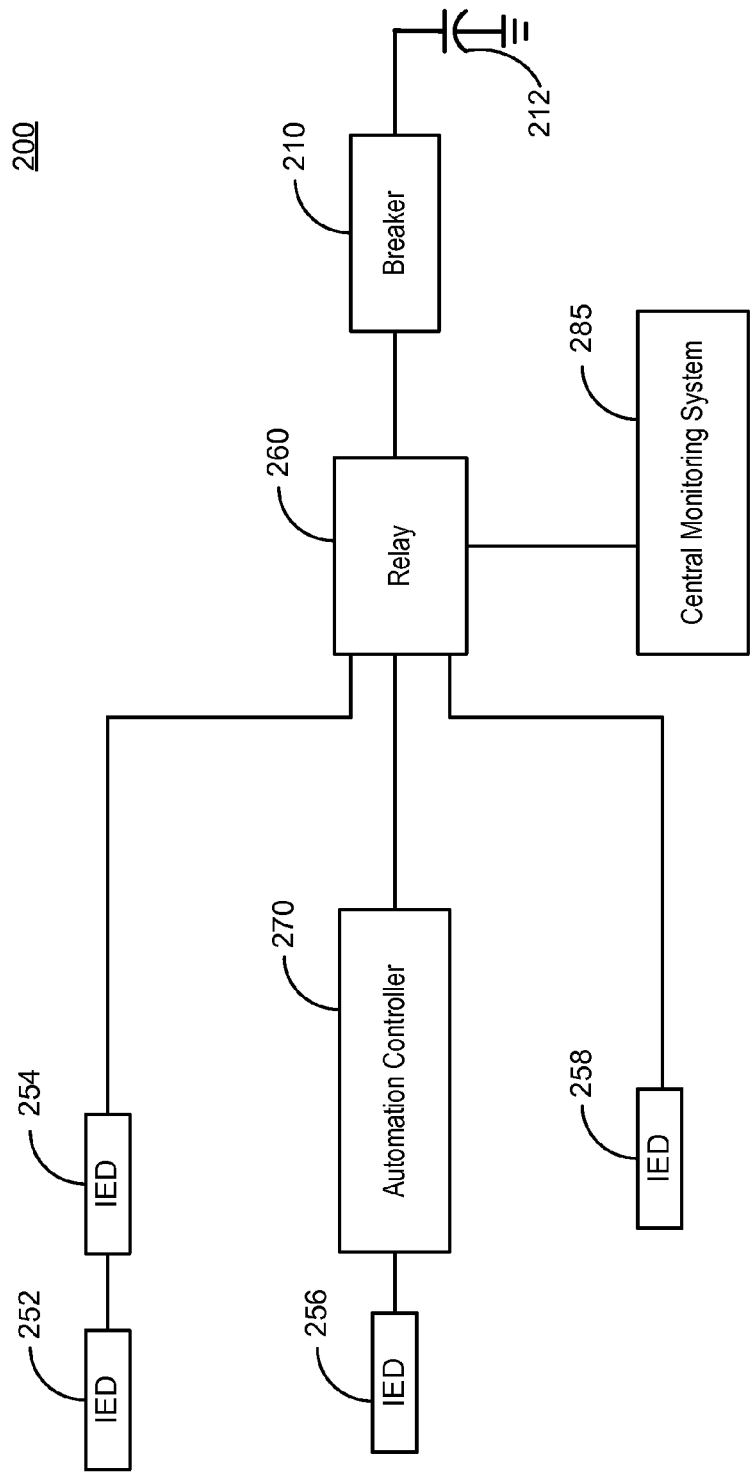
FIG. 2 is a block diagram of a system configured to detect poorly damped oscillation modes.

FIG. 2 is a block diagram of a system 200 configured to detect poorly damped oscillation modes. The system 200 may include a relay 260 configured to calculate a damping ratio for one or more oscillation modes of interest and perform a control action if a poorly damped oscillation mode is detected. For example, the relay 260 may be communicatively coupled to a breaker 210 configured to selectively couple a capacitor bank 212 to the electric power delivery system. The relay 260 may instruct the breaker 210 to couple or uncouple the capacitor bank 212 in response to detecting the poorly damped oscillation mode. In other embodiments, an IED other than a relay, an automation controller, a central monitoring system, and/or the like may calculate the damping ratio.

The relay 260 may receive monitored system data that includes a plurality of measurement signals to be used to calculate the damping ratio. The monitored system data may be received from one or more IEDs 252-258, automation controllers 270, and/or the like. The relay 260 may be directly coupled to one or more of the IEDs 254, 258. Alternatively, or in addition, the monitored system data from one or more of the IEDs 252, 256 may be communicated by an intermediary, such as another IED 254, an automation controller 270, and/or the like. The relay 260 may request the monitored system data from the one or more IEDs 252-258 (e.g., the data may be pulled), and/or the IEDs 252-258 may transmit the monitored system data without first receiving a request (e.g., the data may be pulled). The relay 260 may use the measurement signals contained in the monitored system data to determine the damping ratio.

In some embodiments, the relay 260 may detect a poorly damped oscillation mode and may report the poorly damped oscillation mode and/or any control action taken to a central monitoring system 285. Alternatively, or in addition, the relay 260 may report characteristics of all oscillation modes to the central monitoring system 285. The central monitoring system 285 may instruct the relay 260 on how to respond to the poorly damped oscillation mode, may inform a human operator of the poorly damped oscillation mode, log the occurrence of the poorly damped oscillation mode, and/or the like. Alternatively, or in addition, the relay 260 may transmit measurement signals to the central monitoring system 285, and the central monitoring system 285 may calculate the damping ratio.

Figure 3:
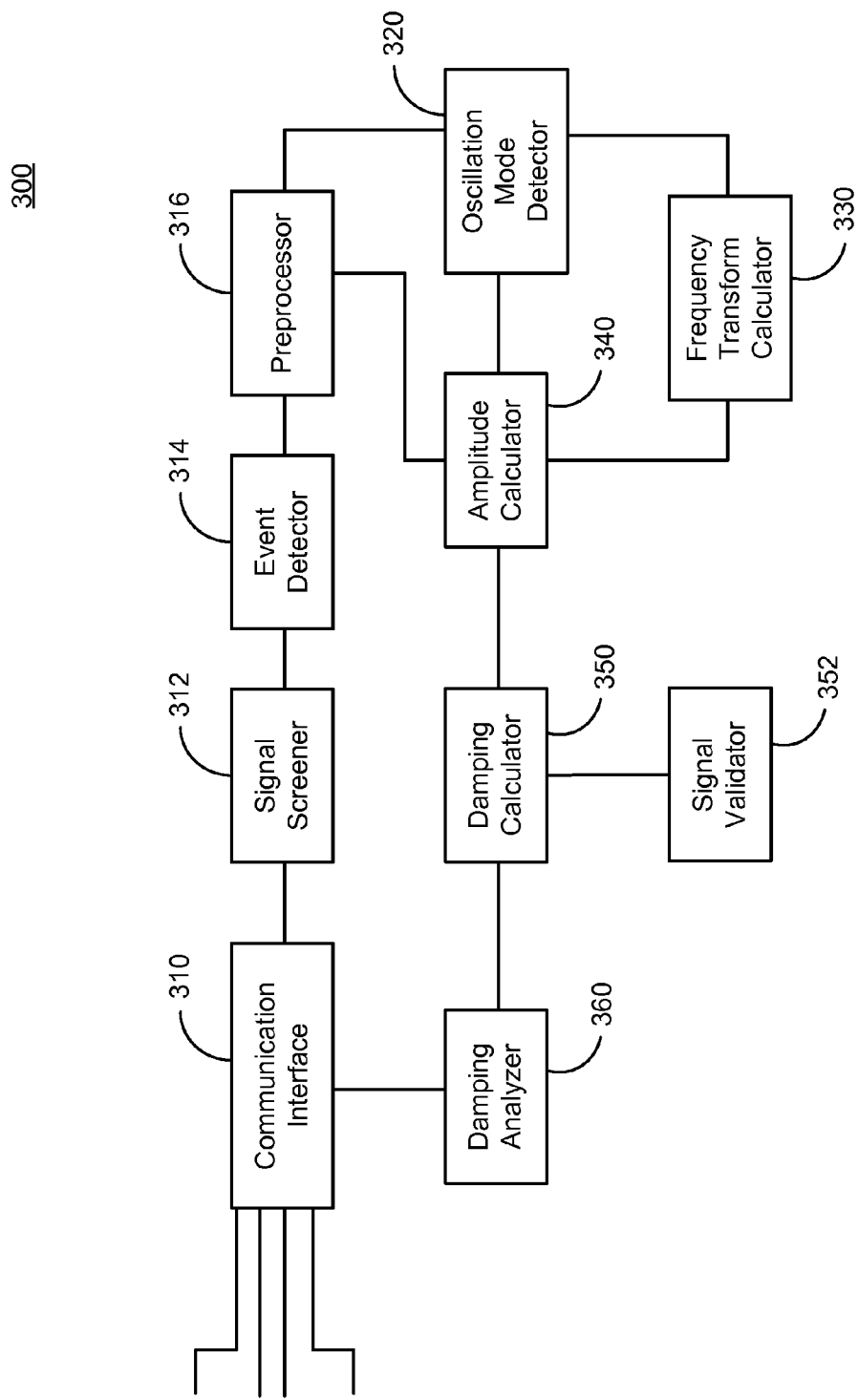
FIG. 3 is a block diagram of a system for calculating a damping ratio.

FIG. 3 is a block diagram of a system 300 for calculating a damping ratio. The system 300 may include a communication interface 310 configured to deliver and receive communications from other components of the electric power delivery system. For example, the communication interface 310 may be configured to receive monitored system data, to transmit control actions, to report calculated damping ratios, and/or the like. The communication interface 310 may deliver received measurement signals to a signal screener 312. The signal screener 312 may be configured to discard bad measurement signals (e.g., measurement signals that do not contain any data) and/or may be configured to interpolate missing data points in the measurement signals.

The signal screener 312 may provide screened measurement signals to an event detector 314. The event detector 314 may be configured to detect whether an event has occurred in one or more of the screened measurement signals. Alternatively, or in addition, the event detector 314 may be configured to determine whether a detected event is less than a predetermined threshold. If an event has occurred and it is less than the predetermined threshold, the event detector 314 may provide the measurement signals to a preprocessor 316. The preprocessor 316 may be configured to remove a mean value from the measurement signals, normalize the measurement signals, remove drift from the measurement signals, and/or the like.

The preprocessor 316 may provide preprocessed measurement signals to an oscillation mode detector 320 and/or an amplitude calculator 340. The oscillation mode detector 320 may be configured to identify one or more oscillation modes of interest in one or more of the measurement signals. The oscillation mode detector 320 may leverage a frequency transform calculator 330 to calculate frequency transforms of one or more of the one or more measurement signals. The one or more oscillation modes of interest may be determined from the frequency transforms. The oscillation mode detector 320 may indicate the one or more oscillation modes of interest to the amplitude calculator 340. The amplitude calculator 340 may determine a step size, a sliding window size, a static window size, and/or the like for analyzing the one or more measurement signals. The amplitude calculator 340 may leverage the frequency transform calculator 330 to calculate the amplitudes of the oscillation mode of interest over the sliding window.

The amplitude calculator 340 may provide the calculated amplitudes to a damping calculator 350. The damping calculator 350 may solve a linearized system of equations to determine a damping ratio for each oscillation mode of interest, which may include calculating the slope of a best fit line that minimizes a least square error). The damping calculator 350 may be communicatively coupled to a signal validator 352 configured to calculate a statistical measure of validity of the damping ratio and/or one or more of the measurement signals used to calculate the damping ratio. The signal validator 352 may indicate one or more invalid signals to the damping calculator 350. The damping calculator 350 may be configured to recalculate the damping ratio without the one or more invalid signals.

The damping calculator 350 may provide the damping ratio for each oscillation mode of interest to a damping analyzer 360. The damping analyzer 360 may determine whether a control action should be performed and/or which control action should be performed. The damping analyzer 360 may instruct the communication interface 310 to transmit the control action to the appropriate recipient. Alternatively, or in addition, the damping analyzer 360 may determine that a damping ratio should be reported to one or more recipients, and the damping analyzer 360 may instruct the communication interface 310 to transmit the damping ratio to the one or more recipients.

Figure 4:
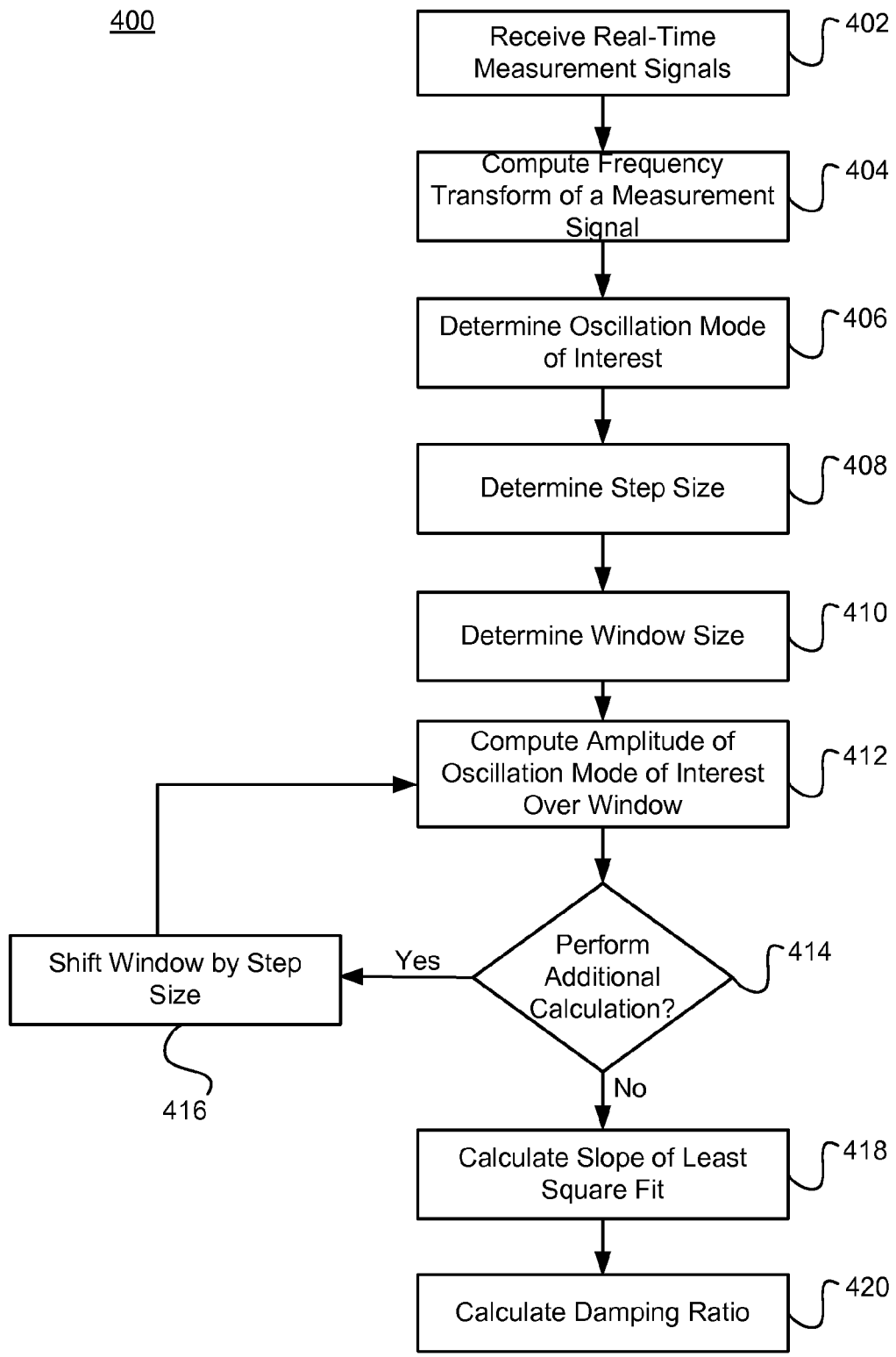
FIG. 4 is a flow diagram of a method of computing a damping ratio from a plurality of real-time measurement signals.

FIG. 4 is a flow diagram of a method 400 of computing a damping ratio from a plurality of real-time measurement signals. The method 400 may begin by receiving 402 a plurality of real-time measurement signals. A frequency transform may be computed 404 of one of the plurality of real-time measurement signals. Frequency transforms may be calculated for a single measurement signal, for a subset of representative measurement signals, and/or for the entire plurality of real-time measurement signals. The frequency transform may be a fast Fourier transform.

An oscillation mode of interest may be determined 406 from the frequency transform. The oscillation mode of interest may be a frequency with a largest amplitude, may be a frequency with an amplitude greater than a predetermined threshold, and/or the like. There may be more than, fewer than, or exactly one oscillation mode of interest per frequency transform/measurement signal. A step size may be determined 408 for use in calculating the damping ratio. The step size may be a predetermined multiple of the period of the oscillation mode of interest (e.g., 0.25, 0.5, 1, 2, 3, 4, etc. times the period). Alternatively, the step size may be predetermined, and determining 408 the step size may simply include loading the step size from memory.

A window size may be determined 410 for use in calculating the damping ratio. The window size may be the size of a sliding window over which amplitudes of the oscillation mode of interest are computed. The window size may be a predetermined multiple of the period of the oscillation mode of interest, such as 1, 2, 3, 4, 5, 6, 8, 10, etc. times the period. Alternatively, the window size may be predetermined, and determining 410 the window size may simply include loading the window size from memory. Alternatively, or in addition, the size of a static window in which the sliding window is shifted may be determined. The size of the static window may be dynamically determined as a multiple of the period (e.g., 2, 3, 4, 5, 6, 8, 10, 12, 15, 20, etc. times the period), and/or may be predetermined.

The amplitude of the oscillation mode of interest in each measurement signal may be computed 412 over the sliding window. The amplitude may be computed 412 by computing a frequency transform (e.g., a fast Fourier transform) of the measurement signal at the oscillation mode of interest. Next, it may be determined 414 whether additional calculations need to be performed. For example, if the sliding window has reached the end of the static window, then it may be determined that no more calculations need to be performed. Otherwise, the sliding window may be shifted 416 by the step size. Additional amplitudes may be computed 412 until the sliding window reaches the end of the static window. The sliding window may remain entirely within the static window and may reach the end of the static window when the right edge of the sliding window is less than a step size from the right edge of the static window.

A slope may be calculated 418 for a least square fit line. The least square fit line may be a best fit line for the logarithms of the plurality of amplitudes from a measurement signal. The logarithm may be taken, because the oscillation mode of interest may be assumed to grow or decay exponentially. The slope of the best fit line for the logarithms may give the rate of growth or decay. A best fit line may be found for each of the plurality of measurement signals. However, it may be assumed that the oscillation mode of interest dampens at the same rate in all the measurement signals, so a common slope may be calculated 418 across the plurality of measurement signals. However, each measurement signal may have a distinct offset. By using a plurality of measurement signals to calculate the slope, a better estimate of the decay may be achieved (e.g., by compensating for random error in individual signals). The least square estimate may be computed quickly even for a large number of measurement signals on a slower processor. Thus, even an IED, such as a relay, may be able to quickly determine an accurate estimate of the rate of growth or decay of the oscillation mode of interest.

The least square fit may be calculated 418 through matrix manipulation. For example, the common slope may be determined by finding the least square fit for the equation:

$$\overline{Y} = \overline{X} * \beta \quad (1)$$

$$\begin{bmatrix} \ln(Y_{1,1}) \\ \cdots \\ \ln(Y_{1,K}) \\ \ln(Y_{2,1}) \\ \cdots \\ \ln(Y_{m,K}) \end{bmatrix} = \begin{bmatrix} X_1 & 1 & 0 & \cdots & 0 \\ \cdots & \cdots & \cdots & \cdots & \cdots \\ X_K & 1 & 0 & \cdots & 0 \\ X_1 & 0 & 1 & \cdots & 0 \\ \cdots & \cdots & \cdots & \cdots & \cdots \\ X_K & 0 & 0 & \cdots & 1 \end{bmatrix} \begin{bmatrix} \sigma_j \\ b_1 \\ b_2 \\ \cdots \\ b_m \end{bmatrix} \quad (2)$$

wherein $\overline{Y}$ is the plurality of logarithms of the amplitudes from each measurement signal with $Y_{n,p}$ being the amplitude of the $p^{th}$ point in the $n^{th}$ measurement signal, $\overline{X}$ is the end time of each sliding window corresponding to an amplitude in $\overline{Y}$ with $X_p$ being the end time for the sliding window corresponding to the $p^{th}$ point in a measurement signal, and $\beta$ is the parameters for the plurality of best fit lines with $\sigma_j$ being the common slope for oscillation mode j in the plurality of best fit lines and $b_n$ being the offset (e.g., y-intercept) for the $n^{th}$ measurement signal. The least square estimate, $\hat{\beta}$ can then be computed using the equation:

$$\hat{\beta} = (\overline{X}^T W \overline{X})^{-1} \overline{X}^T W \overline{Y} \quad (3)$$

wherein W is a diagonal matrix of relative weights for the least square estimation (e.g., to compensate for heteroscedasticity in the computed amplitudes). In some embodiments, only the calculations necessary to determine the common slope may be performed rather than computing the entire least square fit for each measurement signal.

A damping ratio may be calculated 420 from the common slope. In an embodiment, the damping ratio, $\zeta_j$, may be determined according to the equation:

$$\zeta_j = \frac{-\sigma_j}{2\pi f_j} \quad (4)$$

wherein $f_j$ is the frequency of the oscillation mode of interest. A larger damping ratio may indicate that the oscillation mode is heavily damped whereas a small or negative damping ratio may indicate that the oscillation mode is poorly and/or negatively damped. Once the damping ratio has been computed, the method 400 may end until another damping ratio is to be computed.

Figure 5A:
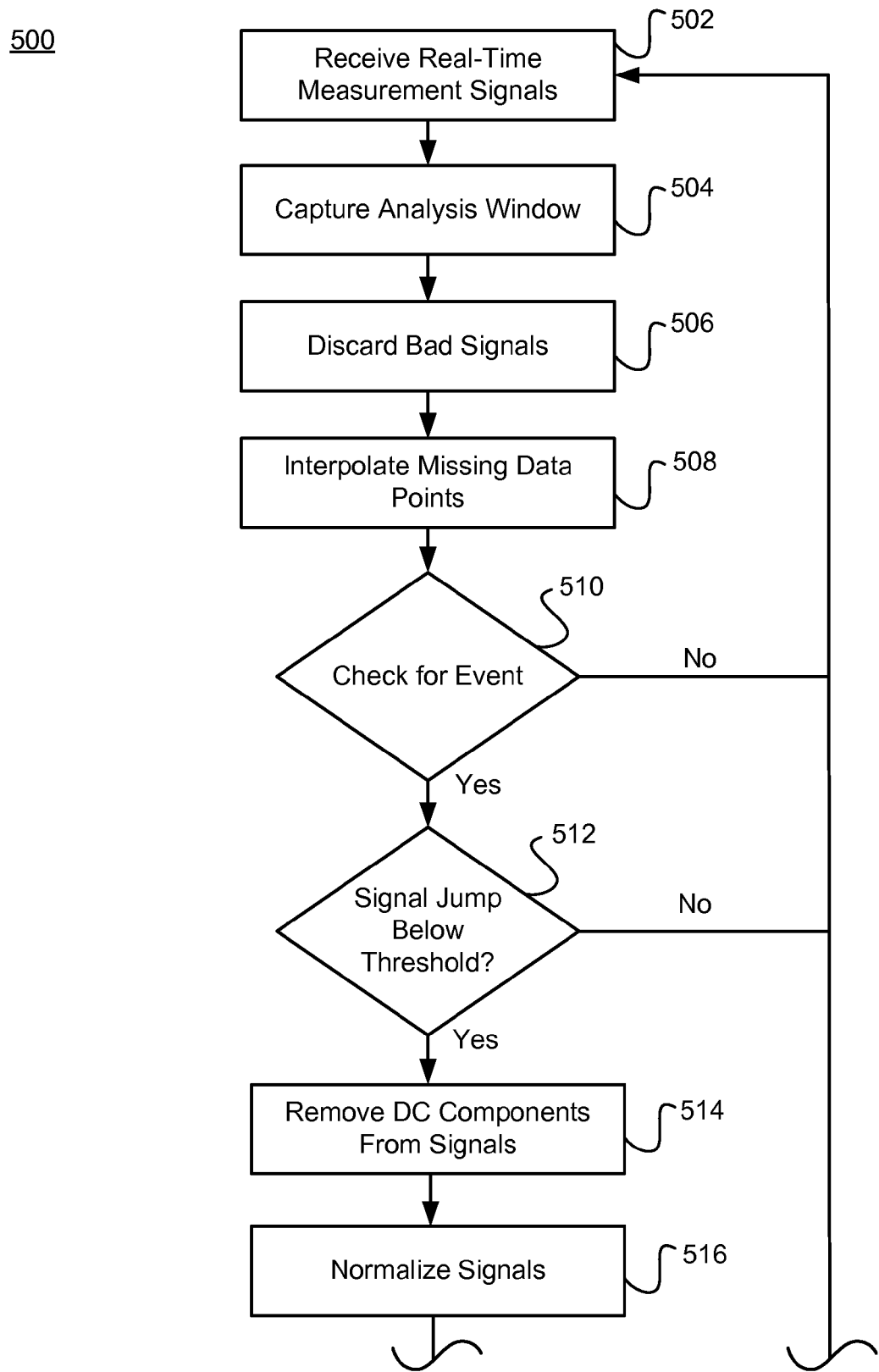
FIGS. 5A and 5B are a flow diagram of a method of detecting and correcting poorly damped oscillations.
Figure 5B:
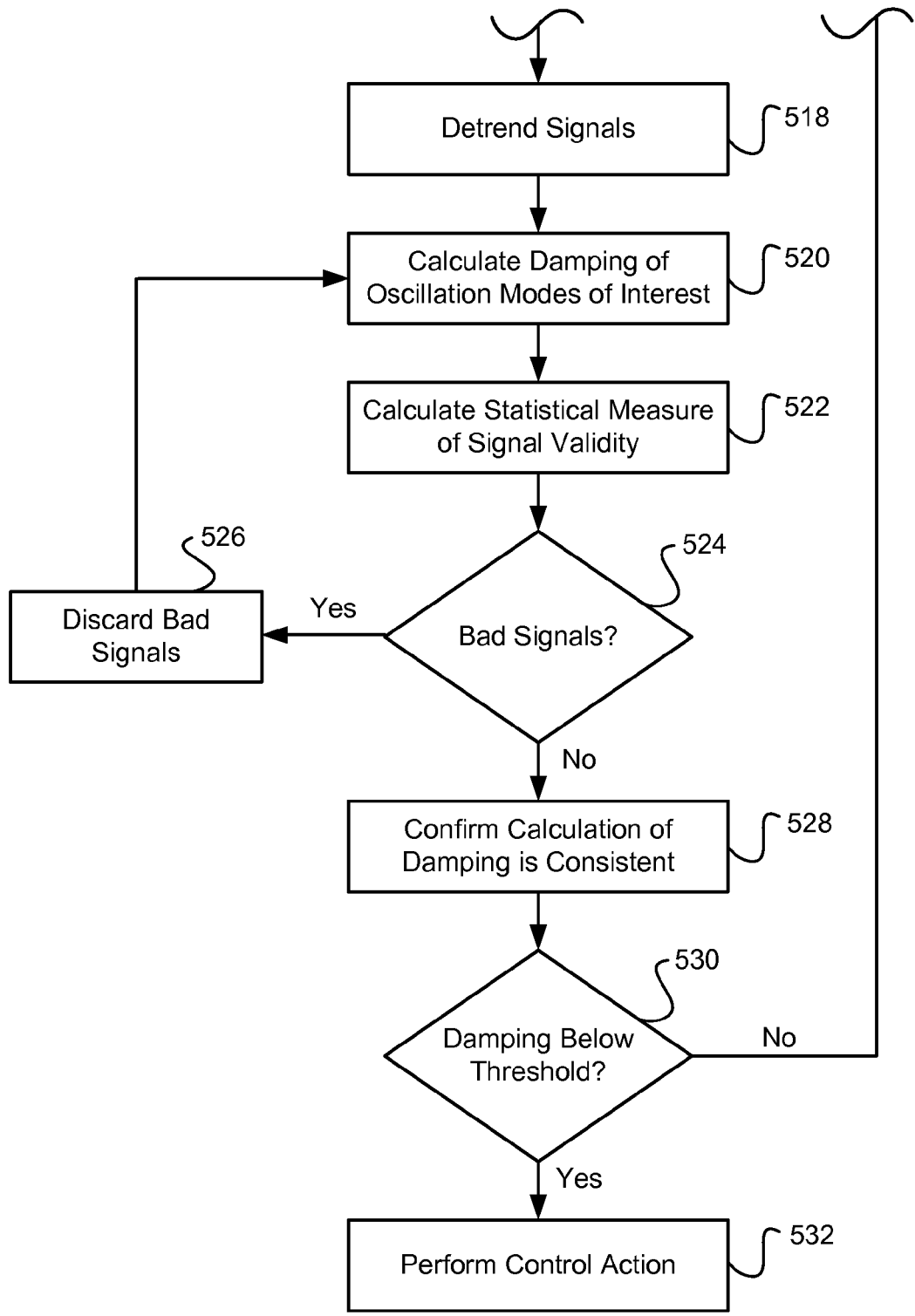

FIGS. 5A and 5B are a flow diagram of a method 500 of detecting and correcting poorly damped oscillations. The method 500 may begin by receiving 502 a plurality of real-time measurement signals. A static analysis window may be captured 504 for each of the plurality of measurement signals. Data sanity checks may be performed for each measurement signal over the static analysis window. Measurement signals that are bad may be discarded 506 from the plurality of measurement signals. For example, a measurement signal may not contain any data or may contain all zeros. Such measurement signals may be identified and discarded 506. Measurement signals that are missing data points may have those data points interpolated 508 and replaced. Similarly, data points with a value of zero or that are otherwise unrealistic may also be replaced. The number of missing data points in a particular measurement signal may be compared to a predetermined threshold to determine whether that measurement signal should be discarded 506 or corrected through interpolation 508.

One or more of the measurement signals may then be checked 510 to determine if an event occurred. An event may include a sudden disturbance and/or a slow evolving oscillation. A sudden disturbance may be detected by determining whether a change in a measurement signal value (e.g., a change in a voltage and/or current magnitude, a change in frequency, etc.) is above a predetermined threshold. A slow evolving oscillation may be detected by monitoring the coefficient of variance of the static analysis window as is known to those of skill in the art. If an event has not occurred, the method 500 may not continue and may return to receiving 502 measurement signals. If an event has occurred, the event may be analyzed to determine 512 if a signal jump is below a predetermined threshold. For example, a change in a measurement signal (e.g., a change in a voltage and/or current magnitude, a change in frequency, etc.) may be compared to a predetermined threshold. If the signal jump is not below the predetermined threshold, real-time measurement signals will continue to be received 502 until the signal jump leaves the analysis window. If the signal jump is below the predetermined threshold and/or the signal jump has left the analysis window, the method 500 may continue to step 514.

DC components may be removed 514 from each measurement signal, for example, by subtracting a mean value of the static analysis window from each value in the static analysis window. Each measurement signal may be normalized 516 after the mean value has been removed, for example, by dividing each value in the static analysis window by a maximum value. Each measurement signal may also be detrended 518 to remove any drift. Detrending 518 may include fitting a low order polynomial to each measurement signal and then subtracting the low order polynomial from the corresponding measurement signal. Detrending 518 may improve the accuracy of the damping calculations.

The damping of the oscillation mode of interest may be calculated 520, for example, using the method 400. The damping may be a damping ratio, damping rate, and/or the like. To confirm all the measurement signals used to calculate 520 the damping are valid, a statistical measure of validity may be calculated 522 for the damping. For example, a standard $\chi^2$ statistical test may be used to compare the measurement signals with the common slope and the plurality of offsets calculated in step 520. The statistical measure of validity may be computed for all the measurement signals together and/or for each measurement signal individually. In an embodiment, statistical measures of validity may be calculated for each measurement signal only if the statistical measure for all the measurement signals indicates invalidity. A predetermined confidence threshold may be used to determine invalidity.

It may be determined 524 whether the statistical measure of validity indicates that there are bad measurement signals. If there are bad signals, the bad signals may be discarded 526, and the method 500 may return to step 520 to recalculate the damping of the oscillation mode of interest without the bad signals. The bad signals may be discarded 526 one at a time, and/or all measurement signals that fails to satisfy the statistical measure of validity may be discarded. Once the statistical measure of validity indicates that the damping calculation is valid, the method 500 may proceed to step 528.

The damping may be confirmed 528 to be consistent across a plurality of calculations. For example, the calculated damping ratio may be stored each time the method 500 is performed, and the current damping ratio may be compared with a predetermined number of previously calculated damping ratios. It may be determined 530 whether the damping calculations are consistently below a predetermined threshold. For example, steps 528 and 530 may include determining whether a predetermined number of damping calculations in a row are below the predetermined threshold.

If the damping calculations are not below the predetermined threshold, the method 500 may return to step 502 and continue to monitor for poorly damped oscillation modes. Otherwise, one or more control actions may be performed 532 to correct the poorly damped oscillation mode. Alternatively, or in addition, if the damping calculations are consistent, one or more characteristics (e.g., frequency of the oscillation mode of interest, damping ratio, mode shape, etc.) may be reported, for example, to a central monitoring system. In an embodiment, the characteristics may be reported regardless of whether a poorly damped oscillation mode has been detected or not. Once the control action is taken, the method 500 may end until the measurement signals need to be checked again for poorly damped oscillation modes.

While specific embodiments and applications of the disclosure have been illustrated and described, it is to be understood that the disclosure is not limited to the precise configuration and components disclosed herein. Various modifications, changes, and variations apparent to those of skill in the art may be made in the arrangement, operation, and details of the methods and systems of the disclosure without departing from the spirit and scope of the disclosure. The scope of the present disclosure should, therefore, be determined only by the following claims.

The invention claimed is:

1. A device for detecting poorly damped oscillation modes in an electric power delivery system, the device comprising:
   a communications interface configured to receive a plurality of measurement signals comprising real-time electric power delivery system information;
   a frequency transform calculator configured to compute a frequency transform of at least one of the plurality of measurement signals;
   an oscillation mode detector configured to determine an oscillation mode of interest based on the frequency transform;
   an amplitude calculator configured to:
   determine a sliding window size based on a predetermined multiple of a period of the oscillation mode of interest;
   determine a step size for the sliding window based on a predetermined multiple of the period of the oscillation mode of interest;
   determine a static window size based on a predetermined multiple of the period of the oscillation mode of interest;
   calculate amplitudes of the oscillation mode of interest over the sliding window;
   and, a damping calculator configured to compute a damping of the oscillation mode of interest based on changes over time in the amplitudes of the oscillation mode of interest in the plurality of measurement signals, wherein the frequency transform calculator is further configured to compute the amplitudes over the sliding window during the static window, and wherein the changes over time in the amplitudes are determined by shifting the sliding window by the step size, and computing updated amplitudes; and
   the device configured to take a control action when the poorly damped oscillation modes are detected, wherein the control action comprises one of: connecting a capacitor bank, disconnecting the capacitor bank, tripping a relay, or tripping a breaker.

2. The device of claim 1, further comprising a signal screener configured to select a plurality of valid measurement signals from among the plurality of measurement signals.

3. The device of claim 2, wherein the damping is computed based on the plurality of valid measurement signals only.

4. The device of claim 2, wherein the signal screener is configured to determine which of the plurality of measurement signals are valid based on a statistical measure of validity.

5. The device of claim 1, wherein the damping calculator uses a common set of time points to determine the changes over time in the amplitudes.

6. The device of claim 1, wherein the damping calculator solves a linearized system of equations comprising the amplitudes to determine the damping of the oscillation mode of interest.

7. The device of claim 6, wherein the linearized system of equations includes as unknown values the damping of the oscillation mode of interest and a distinct offset for each of the plurality of measurement signals.

8. The device of claim 6, wherein the damping calculator solves the linearized system of equations by determining a least square estimate for the damping of the oscillation mode of interest.

9. The device of claim 1, wherein the amplitudes-and updated amplitudes are computed using a common set of measurement signals.

10. A non-transitory computer readable storage medium comprising program code configured to cause a processor to perform a method of detecting poorly damped oscillation modes in an electric power delivery system, the method comprising:
    receiving a plurality of measurement signals comprising real-time electric power delivery system information;
    computing a frequency transform of at least one of the plurality of measurement signals;
    determining an oscillation mode of interest from the frequency transform;
    computing a sliding window size based on a predetermined multiple of a period of the oscillation mode of interest;
    computing a step size for the sliding window based on a predetermined multiple of the period of the oscillation mode of interest;
    computing a static window size based on a predetermined multiple of the period of the oscillation mode of interest;
    computing a plurality of amplitudes of the oscillation mode of interest corresponding to a plurality of time points, each amplitude of the plurality of amplitudes computed over a sliding window during the static window, the sliding window being shifted by the step size to compute another amplitude of the plurality of amplitudes; and calculating a damping of the oscillation mode of interest based on the plurality of amplitudes computed for each of the plurality of measurement signals; and taking a control action when the poorly damped oscillation modes are detected, wherein the control action comprises one of: connecting a capacitor bank, disconnecting the capacitor bank, tripping a relay, or tripping a breaker.

11. The non-transitory computer readable storage medium of claim 10, wherein the method further comprises initial steps of removing a center mean from each of the plurality of measurement signals and normalizing each of the plurality of the measurement signals.

12. The non-transitory computer readable storage medium of claim 10, wherein the method further comprises an initial step of detrending each of the plurality of measurement signals.

13. The non-transitory computer readable storage medium of claim 12, wherein detrending comprises representing trending as a low-order polynomial and removing the trending.

14. The non-transitory computer readable storage medium of claim 10, wherein calculating the damping comprises solving a linearized system of equations comprising the plurality of amplitudes for each of the plurality of measurement signals.

15. The non-transitory computer readable storage medium of claim 14, wherein solving the linearized system of equations comprises setting up the linearized system of equations to include as unknown values the damping of the oscillation mode of interest and a distinct offset for each of the plurality of measurement signals.

16. The non-transitory computer readable storage medium of claim 14, wherein solving the linearized system of equations comprises determining a least square estimate for the damping of the oscillation mode of interest.

17. The non-transitory computer readable storage medium of claim 14, wherein a common set of measurement signals are used to compute sequential amplitudes of the plurality of amplitudes.

18. A method for detecting poorly damped oscillation modes in an electric power delivery system, the method comprising:

receiving, at an intelligent electronic device (IED), a plurality of measurement signals comprising real-time electric power delivery system information from a plurality of phasor measurement units;

the IED computing a frequency transform from at least one of the plurality of measurement signals;

determining an oscillation mode of interest from the frequency transform;

determining a sliding window size based on a predetermined multiple of a period of the oscillation mode of interest;

determining a step size for the sliding window based on a predetermined multiple of the period of the oscillation mode of interest;

determining a static window size based on a predetermined multiple of the period of the oscillation mode of interest;

the IED computing changes over time in amplitudes of the oscillation mode of interest in the plurality of measurement signals, each change in amplitude calculated for adjacent sliding windows shifted by the step size during the static window; and the IED calculating a damping of the oscillation mode of interest based on the changes over time in the amplitudes; and the IED taking a control action when the poorly damped oscillation modes are detected, wherein the control action comprises one of: connecting a capacitor bank, disconnecting the capacitor bank, tripping a relay, or tripping a breaker.

* * * * *